United States Patent
Yang et al.

(10) Patent No.: US 9,590,041 B1
(45) Date of Patent: Mar. 7, 2017

(54) SEMICONDUCTOR STRUCTURE

(71) Applicant: UNITED MICROELECTRONICS CORP., Hsin-Chu (TW)

(72) Inventors: Yu-Ru Yang, Hsinchu County (TW); Huai-Tzu Chiang, Tainan (TW); Sheng-Hao Lin, Hsinchu County (TW); Shih-Hsien Huang, Kaohsiung (TW); Chien-Hung Chen, Hsinchu County (TW); Chun-Yuan Wu, Yun-Lin County (TW); Cheng-Tzung Tsai, Taipei (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 14/960,430

(22) Filed: Dec. 6, 2015

(30) Foreign Application Priority Data

Oct. 30, 2015 (CN) .......................... 2015 1 0724668

(51) Int. Cl.
| | | |
|---|---|---|
| *H01L 21/02* | (2006.01) | |
| *H01L 29/10* | (2006.01) | |
| *H01L 29/78* | (2006.01) | |
| *H01L 29/165* | (2006.01) | |
| *H01L 29/778* | (2006.01) | |
| *H01L 27/092* | (2006.01) | |

(52) U.S. Cl.
CPC ........ *H01L 29/1054* (2013.01); *H01L 29/165* (2013.01); *H01L 29/785* (2013.01); *H01L 21/02381* (2013.01); *H01L 21/02538* (2013.01); *H01L 27/092* (2013.01); *H01L 29/105* (2013.01); *H01L 29/778* (2013.01)

(58) Field of Classification Search
CPC .......... H01L 21/02381; H01L 33/0073; H01L 21/02505; H01L 29/66636; H01L 21/0254; H01L 29/778; H01L 21/2521; H01L 21/02532; H01L 21/02538; H01L 27/092; H01L 27/0605; H01L 29/105; H01L 29/04
USPC ............... 257/190, 191, 192, 12, 15, 18, 19, 257/E29.193; 438/48, 285, 290
See application file for complete search history.

(56) References Cited

U.S. PATENT DOCUMENTS

| | | | |
|---|---|---|---|
| 7,799,592 B2 | 9/2010 | Lochtefeld | |
| 8,324,660 B2* | 12/2012 | Lochtefeld | ........ H01L 21/02381 257/190 |
| 9,293,534 B2* | 3/2016 | Tsai | .................... H01L 29/0847 |
| 2013/0328126 A1* | 12/2013 | Tsai | .................. H01L 29/41783 257/368 |
| 2015/0206939 A1* | 7/2015 | Huang | .............. H01L 29/66628 257/77 |

(Continued)

*Primary Examiner* — Thinh T Nguyen
(74) *Attorney, Agent, or Firm* — Winston Hsu; Scott Margo

(57) ABSTRACT

A semiconductor structure includes a semiconductor substrate, a dielectric structure formed on the semiconductor substrate and including at least a recess formed therein, a fin formed in the recess, and a dislocation region formed in the fin. The semiconductor substrate includes a first semiconductor material. The fin includes the first semiconductor material and a second semiconductor material. A lattice constant of the second semiconductor material is different from a lattice constant of the first semiconductor material. A topmost portion of the dislocation region is higher than an opening of the recess.

8 Claims, 7 Drawing Sheets

(56) References Cited

U.S. PATENT DOCUMENTS

2015/0270342 A1\* 9/2015 Tsai .................. H01L 29/0847
257/43

\* cited by examiner

SEMICONDUCTOR STRUCTURE

BACKGROUND OF THE INVENTION

1. Field of the Invention

The present invention relates to a semiconductor structure, and more particularly, to an epitaxial semiconductor fin structure.

2. Description of the Prior Art

Epitaxial structures are prevalently used in a wide variety of semiconductor applications. For example, the prior art usually forms an epitaxial layer such as an epitaxial silicon germanium (hereinafter abbreviated as SiGe) layer in a single crystal substrate by performing a selective epitaxial growth (hereinafter abbreviated as SEG) method. Because lattice constant of the epitaxial SiGe layer is larger than that of the silicon substrate, a strain stress is generated to the meta-oxide semiconductor (hereinafter abbreviated as MOS) transistor device. Accordingly, carrier mobility in the channel region is improved and the speed of the MOS transistor device is increased.

Although the epitaxial structures efficiently improve device performance, it increases complexity of the semiconductor fabrication and difficulties of process control. For example, though higher Ge concentration in the epitaxial SiGe layer improves device performances, dislocation defects usually occur in the higher Ge concentration and/or thicker epitaxial SiGe layer due to the lattice mismatch between the materials. The dislocation defect unwantedly reduces the strain stress. Therefore, it is getting more and more difficult to design and fabricate semiconductor devices having epitaxial structures.

Accordingly, though the epitaxial structure is able to improve the device performance, it is always in need to provide semiconductor devices as expected when the progress of semiconductor manufacturing technology is improved and complexity of the products is increased.

SUMMARY OF THE INVENTION

According to an aspect of the present invention, a semiconductor structure is provided. The semiconductor structure includes a semiconductor substrate, a dielectric structure formed on the semiconductor substrate, at least a fin formed on the semiconductor substrate, and a dislocation region formed in the fin. The semiconductor structure includes a first semiconductor material, and the fin includes the first semiconductor material and a second semiconductor material. A lattice constant of the second semiconductor material is different from a lattice constant of the first semiconductor material. The dielectric structure includes a top surface, and the fin includes a first height above the top surface of the dielectric structure. The dislocation region includes a second height above the top surface of the dielectric structure, and the second height of the dislocation region is smaller than one-fourth of the first height of the fin.

According to an aspect of the present invention a semiconductor structure is provided. The semiconductor structure includes a semiconductor substrate, a dielectric structure formed on the semiconductor substrate, at least a recess formed in the dielectric structure, a fin formed in the recess, and a dislocation region formed in the fin. The semiconductor substrate includes a first semiconductor material, and the fin includes the first semiconductor material and a second semiconductor material. A lattice constant of the second semiconductor material is different from a lattice constant of the first semiconductor material. A topmost portion of the dislocation region is higher than an opening of the recess.

According to the semiconductor structure provided by the present invention, the dislocation region which lowers strain stress is confined: a height of the dislocation region above the top surface of the dielectric structure is smaller than one-fourth of the height of the fin above the top surface of the dielectric structure. In other words, the dislocation region is formed away from a surface of the fin. It is well-known that the channel is formed in the surface of the fin in the fin field effect transistor (hereinafter abbreviated as FinFET) device and thus the dislocation region formed away from the surface of the fin renders lowest impacts to the channel region, it even renders none impacts to the channel region. Briefly speaking, according to the semiconductor structure provided by the present invention, even the unwanted dislocation region is formed in the fin, it causes no influence to the transistor device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-7 are schematic drawings illustrating a method for manufacturing a semiconductor structure provided by a preferred embodiment of the present invention, wherein FIG. 2 is a schematic drawing in a step subsequent to FIG. 1, FIG. 3 is a schematic drawing illustrating a modification to the present invention, FIG. 4 is a schematic drawing in a step subsequent to FIG. 2, FIG. 5 is a schematic drawing illustrating another modification to the present invention, FIG. 6 is a schematic drawing in a step subsequent to FIG. 4, and FIG. 7 is a schematic drawing in a step subsequent to FIG. 6.

DETAILED DESCRIPTION

Figure 1:
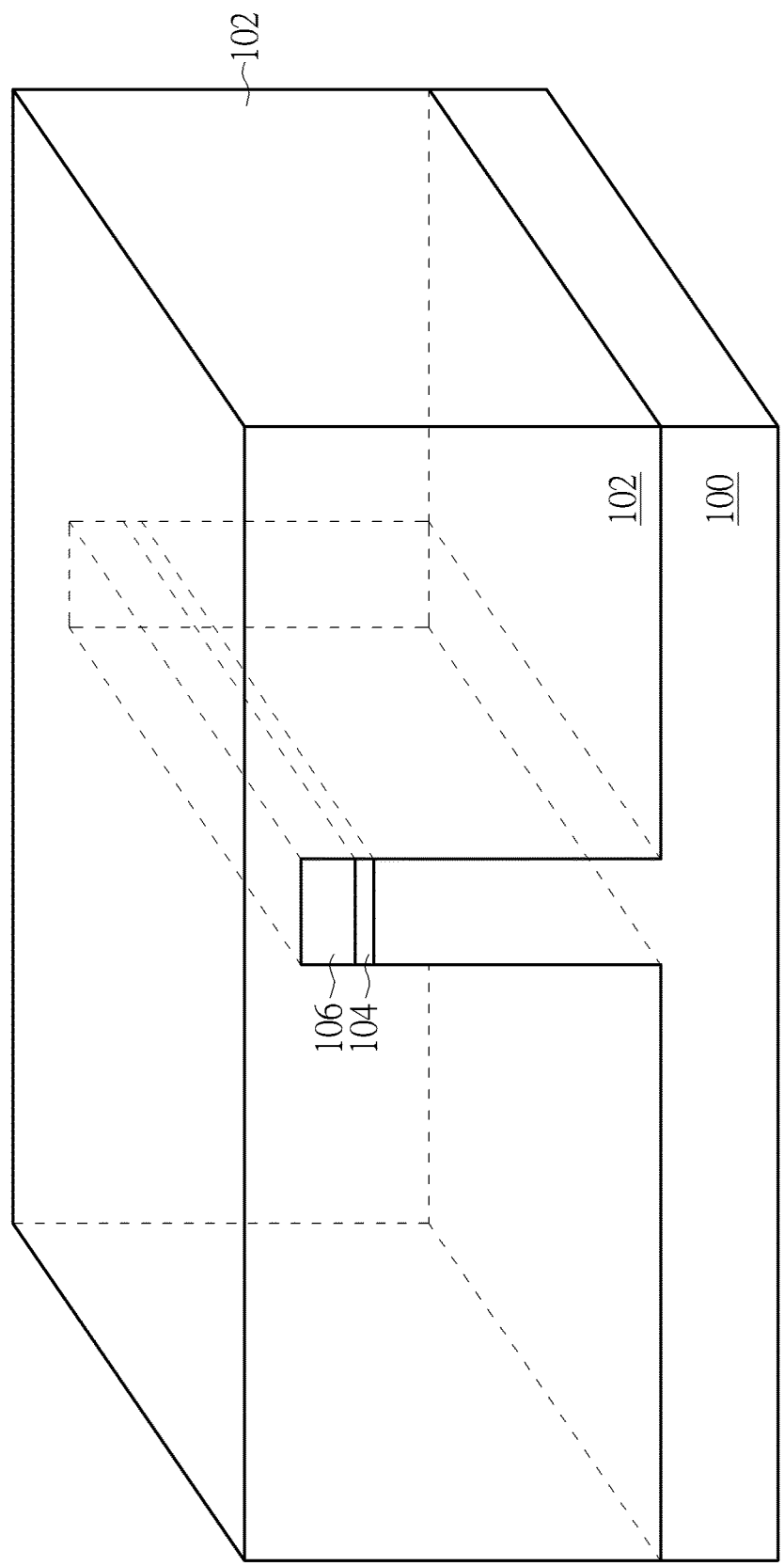

Please refer to FIGS. 1-7, which are schematic drawings illustrating a method for manufacturing a semiconductor structure provided by a preferred embodiment of the present invention. As shown in FIG. 1, a semiconductor substrate 100 is provided by the method. The semiconductor substrate 100 includes a first semiconductor material, and the first semiconductor material may be, for example but not limited to, silicon (Si), germanium (Ge), III-V compound, or II-VI compound. In some embodiments the first semiconductor material preferably includes Si, but not limited to this. Additionally, the semiconductor substrate 100 can be bulk Si substrate with (100) crystal plane. Next, a dielectric structure 102 is formed on the semiconductor substrate 100. The dielectric structure 102 can be formed by any suitable process such as shallow trench isolation (hereinafter abbreviated as STI) fabricating process. Generally speaking, a pad layer 104 and a hard mask layer 106 are formed on the semiconductor substrate 100 and followed by patterning. As shown in FIG. 1, the patterned hard mask layer 106 and pad layer 104 are used to define place and width of fin(s) to be formed, but not limited to this. Next, the semiconductor substrate 100 is etched with the patterned hard mask layer 106 and pad layer 104 serving as etching mask, and thus a plurality of trenches (not shown) are formed in the semiconductor substrate 100. Subsequently, an insulating material 102 is formed to fill up the trenches.

Figure 2:
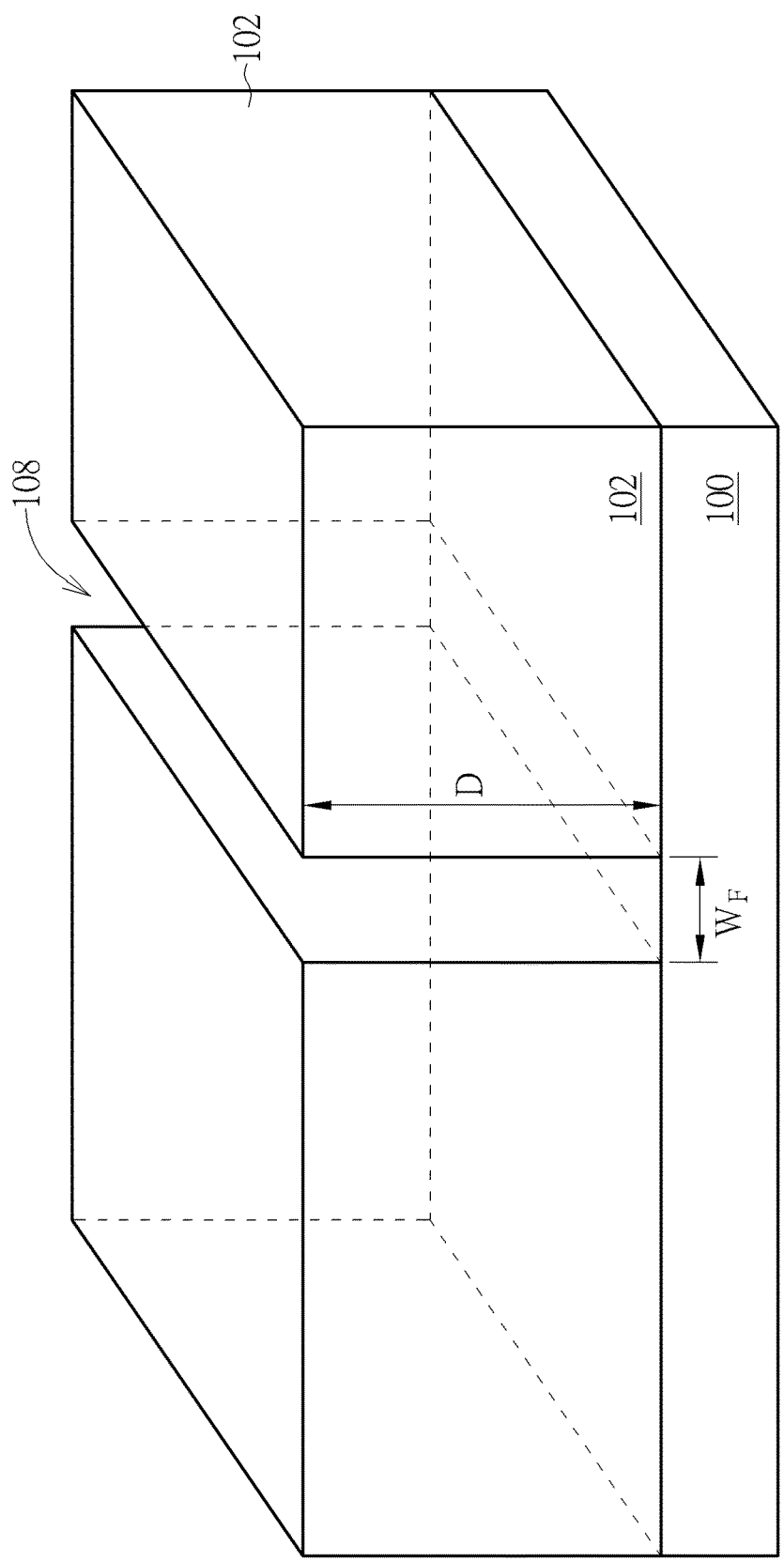

Please refer to FIG. 2. Next, a planarization process is performed to remove superfluous insulating material and the patterned hard mask layer 106/pad layer 104. Consequently, a plurality of STIs are formed on the semiconductor substrate 100, and those STIs are taken as the dielectric structure 102 in the preferred embodiment of the present invention. A proper etching process such as, for example but not limited to, a dry etching process is then performed to remove the semiconductor substrate 100 formed in between the STI 102, and thus at least a recess 108 is formed in the dielectric structure 102. According to the preferred embodiment, a bottom of the recess 108 is coplanar with a bottom of the dielectric structure 102 as shown in FIG. 2. Furthermore, the recess 108 includes a width $W_F$ and a depth D. The width $W_F$ of the recess 108 is equal to a width of the fin(s) to be formed. In some embodiments of the present invention, the width $W_F$ of the recess 108 can be between 5 nanometers (nm) and 15 nm, and the depth D of the recess 104 can be between 100 nm and 300 nm, but not limited to this. In other words, the recess 108 provided by the preferred embodiment includes an aspect ratio of depth over width, and the aspect ratio is between 10 and 60, but not limited to this.

Figure 3:
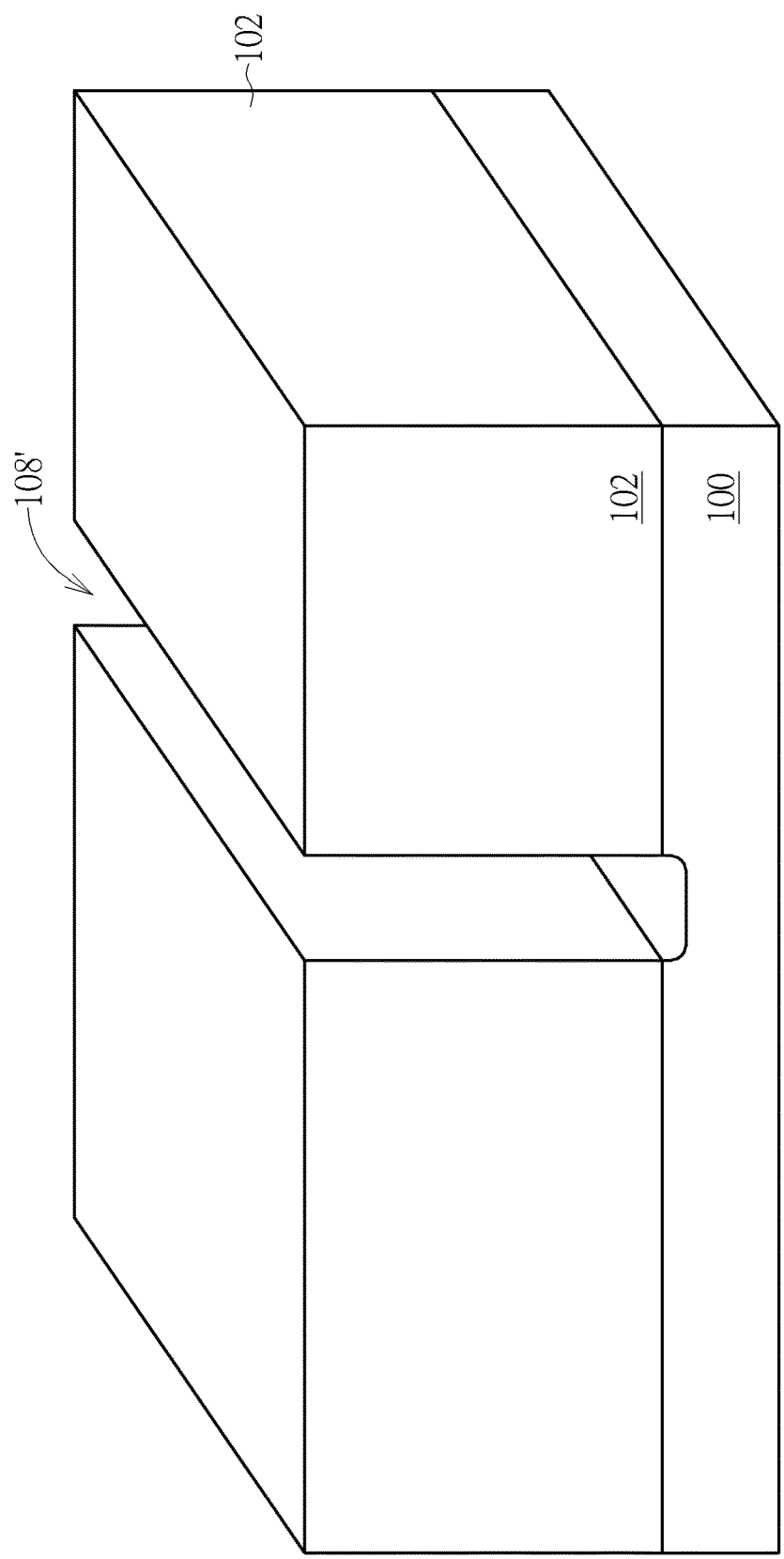

Please refer to FIG. 3, which is a schematic drawing illustrating a modification to the present invention. According to the modification, the dry etching process used to remove the semiconductor substrate 100 in between the dielectric structure 102 can be performed to over-etch the semiconductor substrate 100 and an over-etched recess 108' is obtained as shown in FIG. 3. Accordingly, a bottom of the over-etched recess 108' is lower than the bottom of the dielectric structure 102 as shown in FIG. 3.

Figure 4:
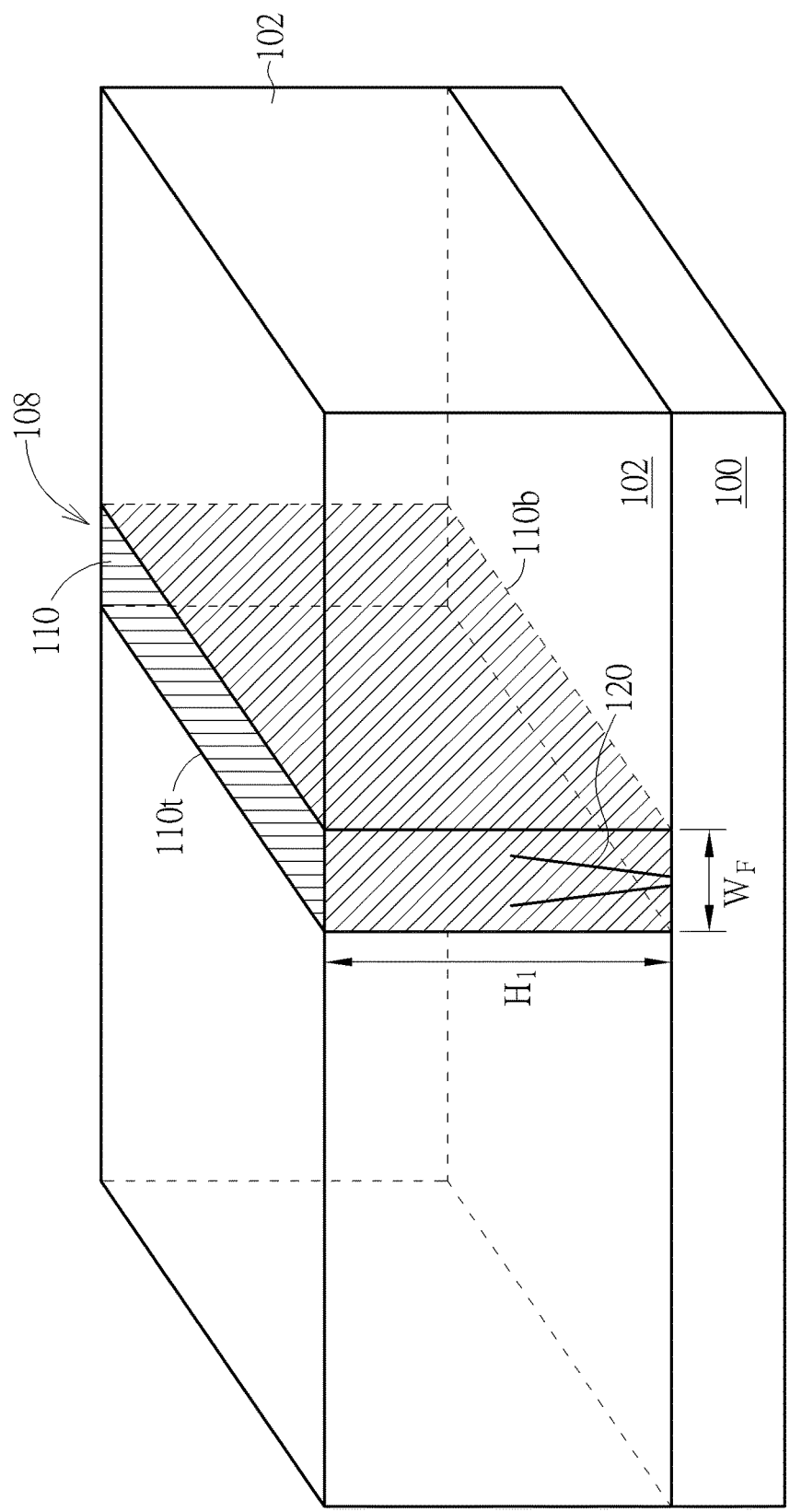

Please refer to FIG. 4. After forming the recess 108/108', an epitaxial layer 110 is formed in the recess 108/108'. In some embodiments of the present invention, the epitaxial layer 110 can be formed by performing a SEG process, but not limited to this. As shown in FIG. 4, the recess 108 is filled up with the epitaxial layer 110. The epitaxial layer 110 includes the aforementioned first semiconductor material and a second semiconductor material, and a lattice constant of the second semiconductor material is different from a lattice constant of first semiconductor material. Preferably, the lattice constant of the second semiconductor material is larger than the lattice constant of first semiconductor material. In some embodiments of the present invention, the second semiconductor material can be Ge, therefore the epitaxial layer 110 includes SiGe. The second semiconductor material in the epitaxial layer 110 includes a first concentration (Ge concentration). In some embodiments of the present invention, for example but not limited to, the first concentration of the second semiconductor material in the epitaxial layer 110 is between 30% and 70%. In some embodiments of the present invention, the first concentration of the second semiconductor material in the epitaxial layer 110 even can be 100%. It is also noteworthy that the epitaxial layer 110 is an undoped epitaxial layer. In other words, the epitaxial layer 110 includes no conductive dopants. Therefore, the epitaxial layer 110 is an intrinsic SiGe layer.

As shown in FIG. 4, since the recess 108 is filled up with the epitaxial layer 110, a height $H_1$ of the epitaxial layer 110, which is defined by a top surface 110t and a bottom surface 110b of the epitaxial layer 110 (or, a distance between the top surface 110t and a surface of the semiconductor substrate 100), is equal to the depth D of the recess 108, and a width of the epitaxial layer 110 is equal to the width $W_F$ of the recess 108. Accordingly, the epitaxial layer 110 includes a ratio of the height $H_1$ over the width $W_F$, and the ratio is equal to aspect ratio of the recess 108, that is between 10 and 60, but not limited to this.

It is noteworthy that the epitaxial layer is always grown along the surface of the semiconductor substrate 100 (Si substrate). However, since the lattice constant of Ge is larger than that of the Si, dislocation defects may spontaneously occur due to the mismatch between the two materials. As shown in FIG. 4, the dislocation defects are upwardly extended from the bottom 110b of the epitaxial layer 110, and thus a dislocation region 120 is formed. It is noteworthy that because the aspect ratio of the recess 108 is between 10 and 60, a height of the dislocation region 120 is confined to be lower than 10 nm.

Figure 5:
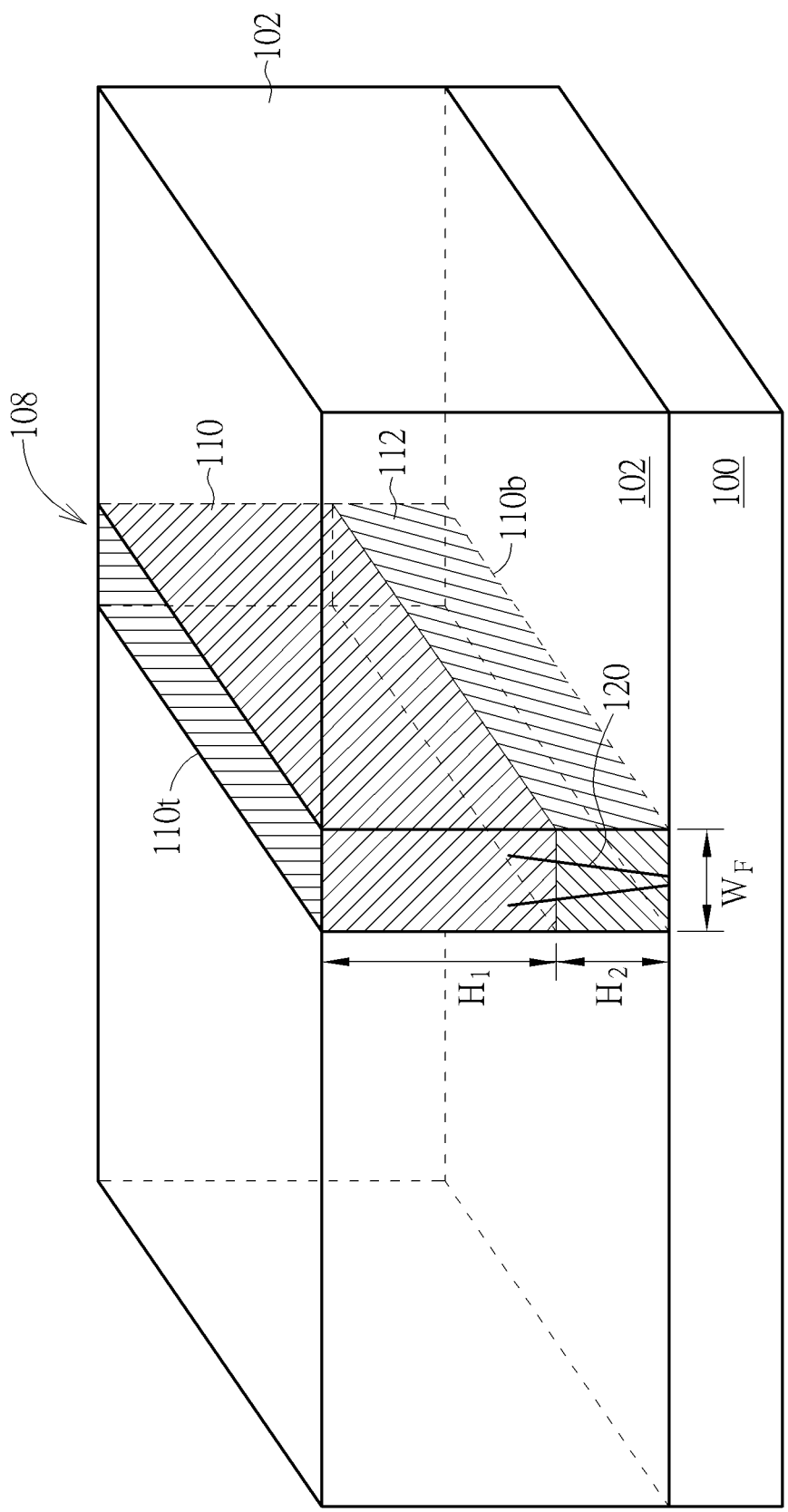

Please refer to FIG. 5, which is a schematic drawing illustrating another modification to the present invention. According to the modification, a strain relax buffer (hereinafter abbreviated as SRB) layer 112 is formed in the recess 108 and followed by forming the epitaxial layer 110. Accordingly, the epitaxial layer 110 is taken as a first portion of a fin, and the SRB layer 112 sandwiched in between the epitaxial layer 110 and the semiconductor substrate 100 is taken as a second portion of the fin. It is noteworthy that the second portion (the SRB layer) 112 includes the first semiconductor material and the second semiconductor material, and the second semiconductor material in the second portion 112 includes a second concentration. More important, the first concentration in the first portion (the epitaxial layer) 110 is larger than the second concentration in the second portion 112. For example, the second concentration of the second semiconductor material in the second portion 112 is between 0% and 50%. And the second concentration of the second semiconductor material in the second portion 112 can be upwardly increased or graded from 0% to 50% in some embodiments of the present invention. Or, the second concentration of the second semiconductor material in the second portion 112 can be predetermined and fixed to 30% in some embodiments of the present invention. It should be easily realized that the second concentration can be predetermined according to different product requirements. It is noteworthy that the second portion 112 is an undoped epitaxial layer. That is, the second portion 112 includes no conductive dopants, and therefore the second portion 112 is also an intrinsic SiGe layer. Furthermore, the second portion 112 includes a height $H_2$, and the height $H_2$ is one-third to a half of the depth D of the recess 108. In some embodiments of the present invention, for example but not limited to, the depth D of the recess 108 is 100 nm and the height $H_2$ of the second portion 112 is 30 nm-50 nm. Additionally, the recess 108 is still filled up with the first portion (the epitaxial layer) 110 formed on the second portion 112.

Please still refer to FIG. 5. Since the Ge concentration of the second portion (the SRB layer) 112 is between the Ge concentration of the epitaxial layer 110 and the Ge concentration of the semiconductor substrate (0%), the lattice mismatch between the SRB layer 112 and the epitaxial layer 110 is smaller. Consequently, dislocation defects are reduced and thus the height of the dislocation region 120 is lowered. Additionally, a thermal treatment can be performed to further reduce defect(s) in the epitaxial layer 110. And it is noteworthy that no gas is involved in the thermal treatment.

Figure 6:
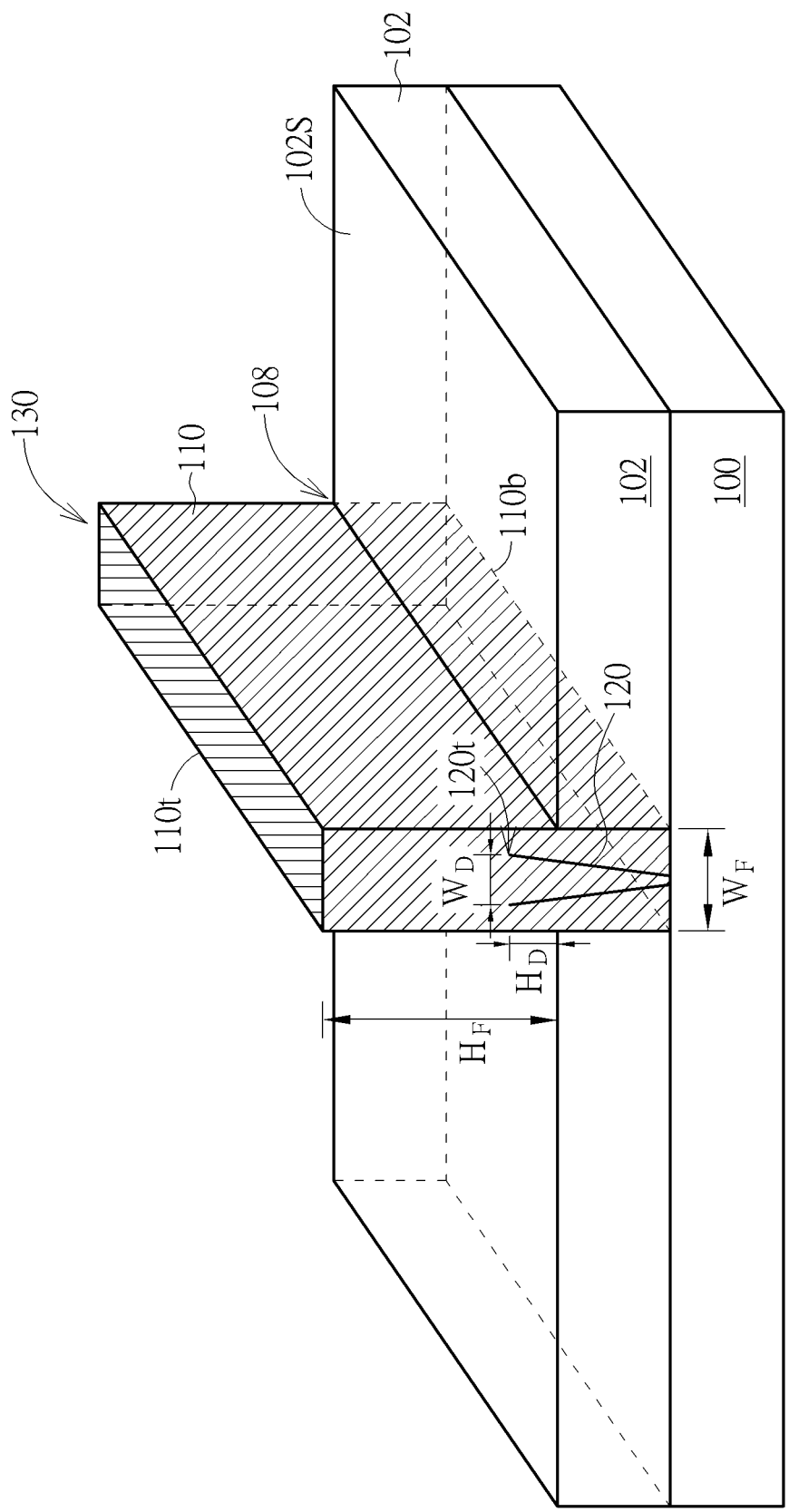

Please refer to FIG. 6. After forming all epitaxial layer(s), an etching back process is performed to remove a portion of the dielectric structure 102. Consequently, a portion of the epitaxial layer 110 is protruded from a top surface 102S of the dielectric structure 102. And thus a fin 130 is formed in the dielectric structure 102 on the semiconductor substrate 100. The fin 130 includes the epitaxial layer 110. Or, as mentioned above, the fin 130 can include the epitaxial layer 110 taken as the first portion and the SRB layer 112 taken as the second portion. As shown in FIG. 6, the fin 130 is protruded from the top surface 102S of the dielectric structure 102, and thus the fin 130 includes a first height $H_F$ above the top surface 102S of the dielectric structure 102. In other words, the first height $H_F$ is the distance between the top surface 110t of the epitaxial layer 110 and the top surface 102S of the dielectric structure 102 after the etching back process. Typically speaking, the first height $H_F$ is also defined as the fin height. In some embodiments of the present invention, the fin height $H_F$ is between 20 nm and 50 nm, but not limited to this. It should be noted that a topmost portion 120t of the dislocation region 120 is higher than an opening of the recess 108 after etching back the dielectric structure 120. Therefore the topmost portion 120t of the dislocation region 120 is also higher than the top surface 102S of the dielectric structure 102 after the etching back process. In detail, the dislocation region 120 includes a second height $H_D$ above the top surface 102S of the dielectric structure 102, and the second height $H_D$ of the dislocation region 120 is smaller than one-fourth of the first height $H_F$ of the fin 130. It is concluded that the top surface 110t of the fin 130 is not only higher than the opening of the recess 108 after the etch back process, but also higher than the topmost portion 120t of the dislocation region 120. Additionally, the fin 130 includes a width $W_F$ between 5 nm and 15 nm while the dislocation region 120 includes a widest width $W_D$ between 3 nm and 7 nm. Therefore a ratio of the widest width $W_D$ of the dislocation region 120 over the width $W_F$ of the fin 130 is smaller than 0.5.

Figure 7:
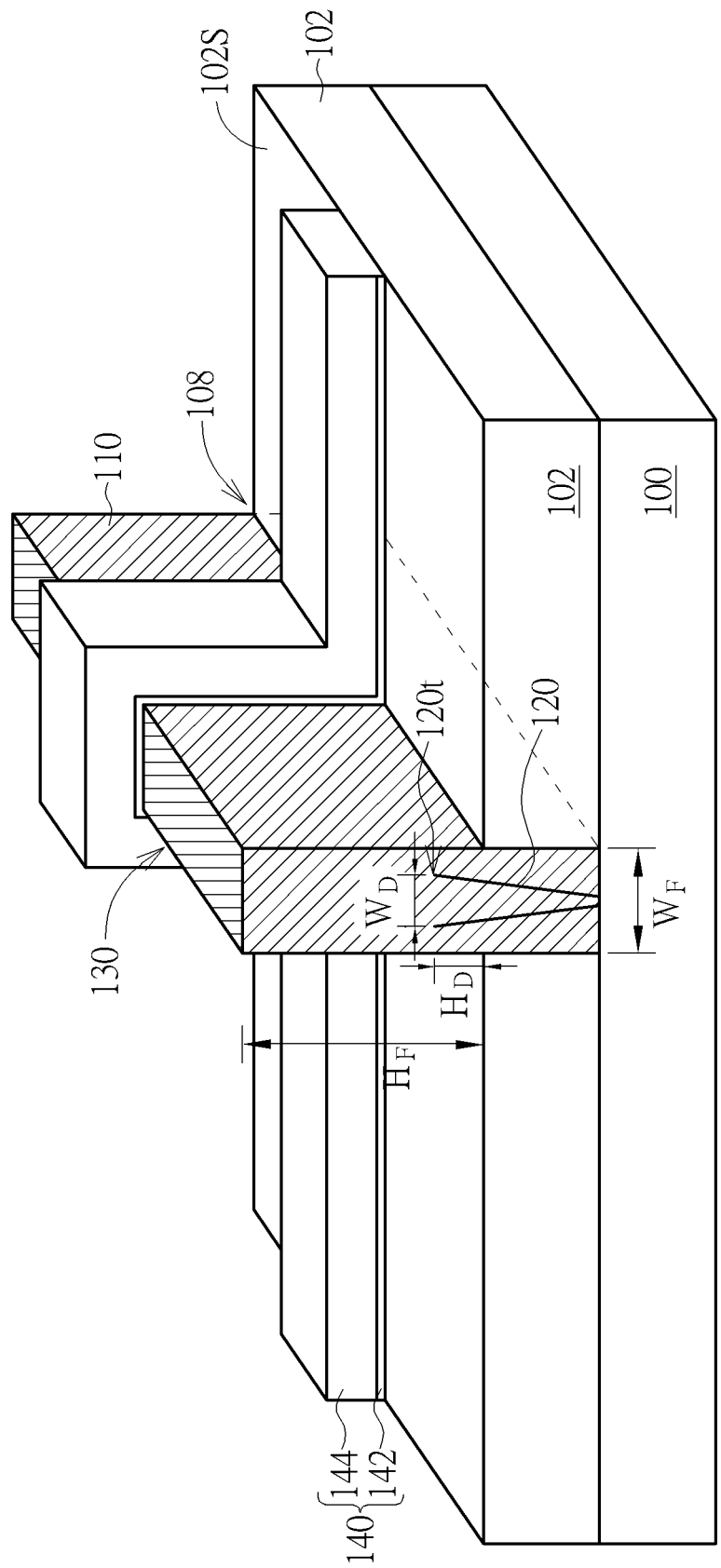

Please refer to FIG. 7. Next, a gate dielectric layer 142 and a gate conductive layer 144 are sequentially formed on the semiconductor substrate 100, particularly on the dielectric structure 102 and the fin 130. The gate dielectric layer 142 and the gate conductive layer 144 are then patterned to form a gate layer 140 on the fin 130. As shown in FIG. 7, an extending direction of the gate layer 140 is perpendicular to an extending direction of the fin 130. And the gate layer 140 covers a portion of the fin 130. In some embodiments of the present invention, the gate dielectric layer 142 can include the conventional dielectric material such as silicon oxide (SiO), silicon nitride (SiN), or silicon oxynitride (SiON). In some embodiments of the present invention, the gate dielectric layer 142 can further include high-K dielectric material such as hafnium oxide (HfO), hafnium silicate (HfSiO), or metal oxide or metal silicate exemplarily of aluminum (Al), zirconium (Zr), lanthanum (La), but not limited to this. In addition, when the gate dielectric layer 142 of the preferred embodiment adopts the high-K dielectric material, the present invention can be further integrated to the metal gate process. Therefore control gate compatible to the high-K gate dielectric layer is obtained. Accordingly, the gate conductive layer 144 can include different materials according to the gate-first or gate-last process. In some embodiments of the present invention integrated to the gate-first process, the gate conductive layer 144 includes metal such as tantalum (Ta), titanium (Ti), ruthenium (Ru), molybdenum (Mo), alloys of the aforementioned metals such as titanium al titanium aluminide (TiAl), metal nitride such as tantalum nitride (TaN), titanium nitride (TiN), molybdenum nitride (MoN), or metal carbide such as tantalum carbide (TaC). It is noteworthy that the metals are chosen by providing proper work function to the multi-gate transistors of different conductivity types. And the gate conductive layer 144 can be a single-layered or multi-layered structure. In some embodiments of the present invention integrated to the gate-last process, the gate conductive layer 144 serves as a dummy gate and includes semiconductor material such as polysilicon. After forming the gate layer 140, other steps for forming FinFET are performed.

According to the semiconductor structure provided by the present invention, a recess with the aspect ratio between 10 and 60 is formed and thus dislocation defects which undesirably lowers strain stress is confined: a height of the dislocation region above the top surface of the dielectric structure is smaller than one-fourth of the height of the fin above the top surface of the dielectric structure. And a widest width of the dislocation region is smaller than a half of the width of the fin. It is concluded that the dislocation region is spontaneously formed away from a surface of the fin due to the aspect ratio of the recess. Furthermore, by introducing the SRB layer before forming the stress-provider epitaxial layer, the growth of the dislocation region is obstructed and thus the dislocation region is formed even further away from the surface of the fin. The dislocation region formed away from the surface of the fin renders lowest impacts to the channel region, it even renders none impacts to the channel region. Briefly speaking, according to the semiconductor structure provided by the present invention, even the unwanted dislocation region is formed in the fin, it causes no influence to the transistor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure comprising:
    a semiconductor substrate comprising a first semiconductor material;
    a dielectric structure formed on the semiconductor substrate, and the dielectric structure comprising at least a recess formed therein;
    a fin formed in the recess, the fin comprising a first portion and a second portion formed between the first portion and the semiconductor substrate, and the first portion and the second portion are formed of the first semiconductor material and a second semiconductor material, wherein a concentration of the second semiconductor material in the first portion is larger than a concentration of the second semiconductor material in the second portion, and a lattice constant of the second semiconductor material being different from a lattice constant of the first semiconductor material; and
    a dislocation region formed in the fin, a topmost portion of the dislocation region being higher than an opening of the recess.

2. The semiconductor structure according to claim 1, wherein the lattice constant of the second semiconductor material is larger than the lattice constant of the first semiconductor material.

3. The semiconductor structure according to claim 1, wherein the fin comprises a height defined by a top surface and a bottom surface of the fin, and the fin comprises a width.

4. The semiconductor structure according to claim 3, wherein the top surface of the fin is higher than the opening of the recess, and higher than the topmost portion of the dislocation region.

5. The semiconductor structure according to claim 3, wherein the width of the fin is equal to a width of the opening of the recess.

6. The semiconductor structure according to claim 3, wherein a ratio of the height of the fin over the width of the fin is between 10 and 60.

7. The semiconductor structure according to claim 1, further comprising a gate layer formed on the fin.

8. The semiconductor structure according to claim 1, wherein a bottom of the recess is lower than a bottom of the dielectric structure.

* * * * *